(12) United States Patent
Park

(10) Patent No.: US 8,217,413 B2
(45) Date of Patent: Jul. 10, 2012

(54) PACKAGE OF LIGHT EMITTING DIODE AND METHOD FOR MANUFACTURING THE SAME

(75) Inventor: Bo Geun Park, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/052,587

(22) Filed: Mar. 21, 2011

(65) Prior Publication Data

US 2011/0169021 A1 Jul. 14, 2011

Related U.S. Application Data

(63) Continuation of application No. 12/162,105, filed as application No. PCT/KR2007/000381 on Jan. 23, 2007, now Pat. No. 7,935,976.

(30) Foreign Application Priority Data

Jan. 26, 2006 (KR) ........................ 10-2006-0008158

(51) Int. Cl.
*H01L 33/00* (2010.01)

(52) U.S. Cl. ...... 257/98; 257/99; 257/100; 257/E33.055; 257/E33.056; 257/E33.57; 257/E33.058; 257/E33.59; 257/E33.066; 257/E33.068

(58) Field of Classification Search ............ 257/98–100, 257/E33.068, E33.055–E33.059, E33.066; 362/609

See application file for complete search history.

(56) References Cited

U.S. PATENT DOCUMENTS

| | | | |
|---|---|---|---|
| 6,233,817 B1 | 5/2001 | Ellis et al. | |
| 6,355,946 B1 | 3/2002 | Ishinaga | |
| 6,707,069 B2 | 3/2004 | Song et al. | |
| 6,943,380 B2 | 9/2005 | Ota et al. | |
| 7,607,801 B2 | 10/2009 | Suehiro et al. | |
| 2006/0071222 A1 | 4/2006 | Yatsuda et al. | |
| 2006/0226435 A1 | 10/2006 | Mok et al. | |

FOREIGN PATENT DOCUMENTS

| | | | |
|---|---|---|---|
| JP | 6-252315 | A | 9/1994 |
| JP | 8-8463 | A | 1/1996 |
| JP | 13036154 | A | 2/2001 |
| JP | 2003-023183 | A | 1/2003 |
| JP | 2003-338639 | A | 11/2003 |
| JP | 2005-39100 | A | 2/2005 |
| JP | 17277382 | A | 10/2005 |
| WO | WO 2004/053933 | A2 | 6/2004 |
| WO | WO 2005/043637 | A1 | 5/2005 |
| WO | WO 2006/095949 | A1 | 9/2006 |

OTHER PUBLICATIONS

Full English machine translation for JP-2003-338639-A published Nov. 28, 2003.
Full English machine translation for JP-8-8463-A published Jan. 12, 1996.
Full English machine translation for JP-2005-39100-A published Feb. 10, 2005.
Full English machine translation for JP-6-252315-A published Sep. 9, 1994.

*Primary Examiner* — Nathan Ha
*Assistant Examiner* — Yu-Hsi D Sun
(74) *Attorney, Agent, or Firm* — Birch, Stewart, Kolasch & Birch, LLP

(57) ABSTRACT

Provided is a package of a light emitting diode. The package according to an embodiment includes a base layer, a light emitting diode chip on the base layer, a lead frame electrically connected to the light emitting diode chip, a reflective coating layer directly on the lead frame, and a molding material covering the light emitting diode chip in a predetermined shape.

14 Claims, 1 Drawing Sheet

[Fig. 1]
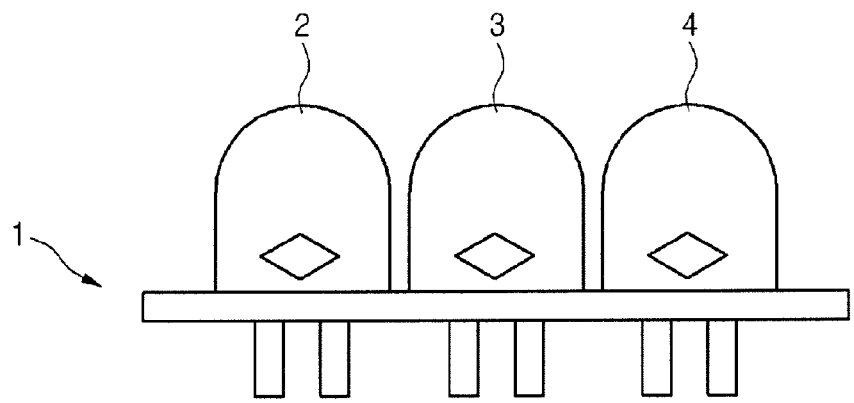
[Fig. 2]
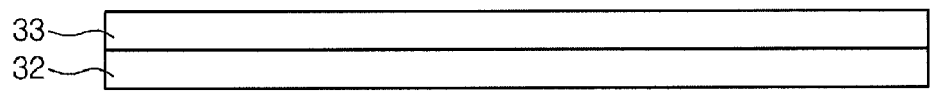
[Fig. 3]
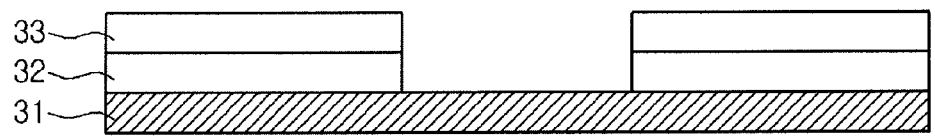
[Fig. 4]
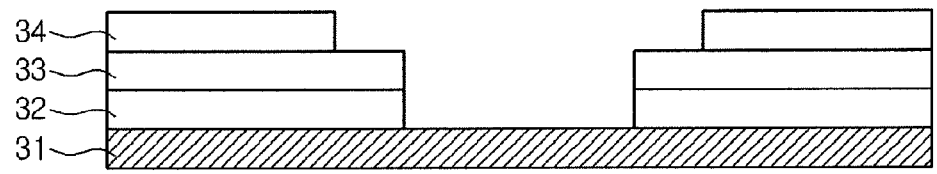
[Fig. 5]
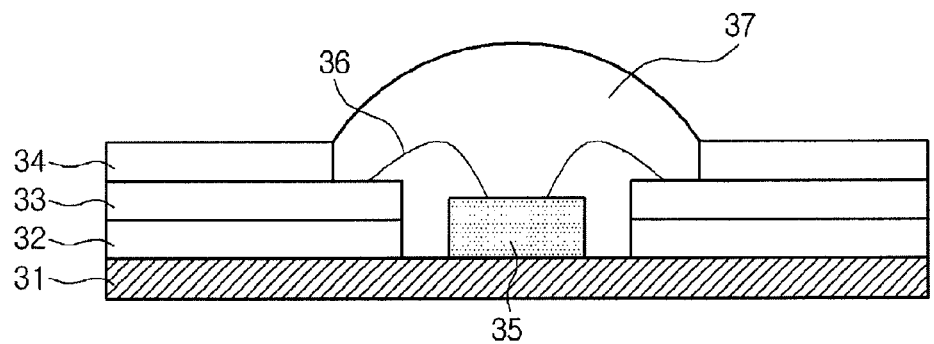

PACKAGE OF LIGHT EMITTING DIODE AND METHOD FOR MANUFACTURING THE SAME

CROSS-REFERENCE FOR RELATED APPLICATIONS

This application is a Continuation of co-pending U.S. patent application Ser. No. 12/162,105 filed on Jul. 24, 2008, which is the national phase of PCT International Application No. PCT/KR2007/000381 filed on Jan. 23, 2007, and which claims priority to Application No. 10-2006-0008158 filed in the Republic of Korea on Jan. 26, 2006. The entire content of all of the above applications is hereby incorporated by reference.

TECHNICAL FIELD

The present invention relates to a package of a light-emitting diode, and a method for manufacturing the same.

BACKGROUND ART

An example of a related art light-emitting diode (LED) module is formed as illustrated in FIG. 1. As for the related art LED module of FIG. 1, each of LED chips corresponding to a red LED 2, a green LED 3 and a blue LED 4 respectively is mounted in one independent package. The package is molded with lens-shaped epoxy to form an individual device as a module.

An example of a related art LED packaging method includes a method of flip-bonding a light-emitting diode chip on a submount of a silicon optical bench (SIOB), or a method of using a metal core printed circuit board (MCPCB).

The MCPCB refers to a chip on board (COB) structure where an LED chip is directly die-bonded to a printed circuit board (PCB), and then wire bonding is performed thereon for electrical connection.

However, in the case where the MCPCB is used among COB type packages according to the related art, an insulating layer is provided on the thick MCPCB. Here, since a lower metal of the MCPCB is flexible while having a thick thickness, deformation may occur when the MCPCB is pressed, a defective rate thus increases, and inconvenience is caused in handling the MCPCB during a process operation.

Also, the thick thickness of the lower metal of the MCPCB according to the related art undesirably obstructs formation of a slim package Furthermore, since the LED chip does not directly contact a metal plate according to the related art, heat generated from the LED chip cannot be sufficiently released.

DISCLOSURE OF INVENTION

Technical Problem

The present invention provides an LED package and a method for manufacturing the same, which can satisfy demands for a slim package by providing a surface mounting type LED package capable of solving disadvantages, such as a thick MCPCB, of the related art LED package.

Technical Solution

In one embodiment of the present invention, there is provided a package of a light emitting diode including: a metal plate; a light-emitting diode chip surface-mounted on the metal plate; an insulating layer on the metal plate, the insulating layer separated from the light-emitting diode chip; a lead frame on the insulating layer; a reflective coating layer on the lead frame; and a molding material molding the light-emitting diode chip in a predetermined shape.

In another embodiment of the present invention, there is provided a method for manufacturing a package of a light-emitting diode, including: forming an insulating layer under a lead frame; forming a light-emitting diode mounting region in the lead frame and the insulating layer; forming a metal plate under the insulating layer in which the light-emitting diode mounting region is formed; forming a reflective coating layer on the lead frame; surface-mounting a light-emitting diode chip on the metal plate in the mounting region; and performing molding on the light-emitting diode chip.

In another embodiment, there is provided a package of a light emitting diode, the package comprising: a base layer; a light emitting diode chip on the base layer; a lead frame electrically connected to the light emitting diode chip; a reflective coating layer directly on the lead frame; and a molding material covering the light emitting diode chip in a predetermined shape, wherein a bottom surface of the reflective coating layer is positioned higher than a bottom surface of the light emitting diode chip, wherein the lead frame includes at least one end portion that is not covered with the reflective coating layer, the at least one portion of the lead frame being adjacent to the light emitting diode chip, and wherein a bottom surface of the reflective coating layer is substantially parallel to a top surface of the base layer.

In another embodiment, there is provided a display device: comprising a package of a light emitting diode, the package including a base layer; a light emitting diode chip on the base layer; a lead frame electrically connected to the light emitting diode chip; a reflective coating layer directly on the lead frame; and a molding material covering the light emitting diode chip in a predetermined shape, wherein a bottom surface of the reflective coating layer is positioned higher than a bottom surface of the light emitting diode chip, wherein the lead frame includes at least one end portion that is not covered with the reflective coating layer, the at least one portion of the lead frame being adjacent to the light emitting diode chip, and wherein a bottom surface of the reflective coating layer is substantially parallel to a top surface of the base layer.

Advantageous Effects

An LED package and a method for manufacturing the same according to the present invention can meet demands for a slim package by using a thin metal plate and thus considerably reducing a thickness of a PCB.

Also, according to the present invention, since an LED chip is mounted on the metal plate, heat generated from the LED chip is directly conducted to the metal plate, and thus effective heat release can be achieved.

BRIEF DESCRIPTION OF THE DRAWINGS

FIG. 1 is an exemplary view of a related art LED package; and

FIGS. 2 through 5 are cross-sectional views of a method for manufacturing an LED package according to an embodiment of the present invention.

MODE FOR THE INVENTION

An LED package and a method for manufacturing the same according to an embodiment of the present invention will now be described in detail with reference accompanying drawings.

It will be understood that when a layer (or film) is referred to as being 'on' or 'under' another layer or substrate, it can be directly on or under the other layer or substrate, or intervening layers may also be present.

FIGS. 2 through 5 are cross-sectional views of a method for manufacturing an LED package according to an embodiment of the present invention.

Referring to FIG. 2, an insulating layer 32 is attached to a lead frame 33.

The lead frame 33 is formed of a copper alloy, and may include a circuit with a predetermined pattern.

Also, the insulating layer 32 may be formed of a glass epoxy-based material, for example, a flame retardant-4 (FR-4) resin 32. Here, the FR-4 resin 32 is an insulator made of a dielectric resin, and has a high mechanical strength and excellent durability, thereby experiencing just small thermal deformation even if the FR-4 resin 32 has a thin thickness. Also, the FR-4 resin 32 is a proper material for formation of multiple layers because of its adhesiveness.

When the FR-4 resin 32 is attached to a surface of the lead frame 33 using a press or a thermo-compression jig, the FR-4 resin 32 is attached thereto by heat applied by the press or the thermo-compression jig because of the adhesiveness of the FR-4 resin 32.

Referring to FIG. 3, an LED mounting region is formed in the lead frame 33 and the FR-4 resin 32.

Specifically, the FR-4 resin 32 and the lead frame 33 that are attached together are punched by a mechanical method, for example, a drilling machine, to for iii a space where an LED chip 35 of FIG. 5 is to be mounted.

Here, an attached plate of the FR-4 resin 32 and the lead frame 33 may be punched to form an LED mounting space having a cylindrical shape or a quadrangle-shaped container.

Instead, a punched section of the FR-4 resin 32 and the lead frame 33 may be an inclined surface that is tapered from the lead frame 33 toward the FR-4 resin 32

Then, referring to FIG. 3, a metal plate 31 is high-temperature compressed and attached to a lower surface of the FR-4 resin 32.

Here, the metal plate 31 may be formed of a metal material having thermal conductivity, such as aluminum (Al) and silver (Au).

Since the metal plate 31 is thinner than that of the related art, the metal plate 31 contributes to considerably reducing the thickness of the PCB to meet demands for a slim package.

For example, the metal plate 31 has a thickness ranging from about 25 D to about 75 D, and acts as a heat sink. Also, as the LED chip 35 of FIG. 5 is mounted on the metal plate 31, so that the demands for the slimness of the LED package can be satisfied.

Also, when the metal plate 31 is high-temperature compressed and attached to the lower surface of the FR-4 resin 32, the press or the thermo-compression jig may be used in the same manner as when the FR-4 resin 32 and the lead frame 33 are attached together.

Then, referring to FIG. 4, a reflective coating layer 34 is formed on an upper surface of the lead frame 33.

Here, the reflective coating layer 34 may be formed of a material with high reflectance in order to improve brightness of light emitted from the LED chip 35.

The reflective coating layer 34 may include a white resin including titanium oxide and resin as main components and formed by mixing calcium carbonate, barium sulfate, zinc oxide, or the like.

Also, the reflective coating layer 34 may be formed using a white pigment besides the white resin.

In the present invention, a screen printing method, not a related art pneumatic dispensing method which has been widely used, is proposed as a method for applying the white resin for the reflective coating layer 34.

As compared to the related art pneumatic dispensing method, the screen printing method can apply the white resin to a relatively large area within a short period of time, and requires a small equipment investment cost.

A screen mask (not shown) having a thickness of, for example, 50 D, is formed on a punched portion of the FR-4 resin 32 and the lead frame 33, specifically, on a space in which the LED chip 35 is to be mounted. Thereafter, a portion excluding the screen mask is filled with the white resin using a squeeze (not shown).

Specifically, the squeeze moves along an upper surface of the screen mask while rubbing a liquid white resin in a preset direction, so that the portion excluding the screen mask can be filled with the liquid white resin.

After the portion excluding the screen mask is filled with the liquid white resin, the screen mask is removed, and annealing is performed at a preset temperature to cure the white resin, and a surface of the white resin is planarized on the same level as the upper surface of the screen mask.

Then, referring to FIG. 5, the LED chip 35 is mounted on the metal plate 31 in the mounting space.

The LED chip 35 is mounted on the metal plate 31 using paste (not shown) having thermal conductivity, and the LED chip 35 and the lead frame 33 can be electrically connected using a wire 36.

Also, in the present invention, the LED chip may be flip-bonded to a silicon optical bench (SIOB) (not shown), the SIOB to which the LED chip flip-bonded has been flip-bonded may be mounted on the metal plate 31, and electrical connection therebetween may be made using a wire.

After the LED chip 35 is mounted, an epoxy resin, as a molding material 37, is injected for molding to a space encompassed by the FR-4 resin 32, the lead frame 33 and the reflective coating layer 34 over the LED chip 35.

A surface mounting type LED package formed in the above-described manner can meet the demands for a slim package since a thin metal layer having a thickness ranging from about 25 D to 75 D is used, and thus a thin thickness of about 0.6 mm to about 0.4 mm is implemented between the reflective coating layer 34 and the metal plate 31.

Also, according to the present invention, since the LED chip is mounted on the metal plate, heat generated from the LED chip can be directly conducted to the metal plate, thereby achieving effective heat-release.

INDUSTRIAL APPLICABILITY

It will be apparent to those skilled in the art that various modifications and variations can be made in the present invention. Thus, it is intended that the present invention covers the modifications and variations of this invention provided they come within the scope of the appended claims and their equivalents.

Specifically, although one LED chip is taken as an example for describing a surface mounting type LED package according to the present invention, the present invention is not limited thereto, and a plurality of packages each including a plurality of LED chips can be implemented and used for a backlight unit of a liquid crystal display (LCD) device.

What is claimed is:

1. A package of a semiconductor light emitting diode, the package comprising:
   a base layer;
   a semiconductor light emitting diode chip on the base layer;
   a lead frame electrically connected to the semiconductor light emitting diode chip;
   a reflective coating layer directly on the lead frame; and
   a molding material covering the semiconductor light emitting diode chip in a predetermined shape,
   wherein a bottom surface of the reflective coating layer is positioned higher than a bottom surface of the semiconductor light emitting diode chip,
   wherein the lead frame includes at least one end portion that is not covered with the reflective coating layer, the at least one portion of the lead frame being adjacent to the semiconductor light emitting diode chip,
   wherein a bottom surface of the reflective coating layer is substantially parallel to a top surface of the base layer,
   wherein a thickness from the bottom surface to a topmost surface of the reflective coating layer is thinner than a thickness from the bottom surface to a topmost surface of the semiconductor light emitting diode chip, and
   wherein the reflective coating lager comprises a white resin including at least one of titanium oxide, calcium carbonate, barium sulfate, and zinc oxide.

2. The package according to claim 1, wherein the base layer comprises a metal.

3. The package according to claim 1, further comprising:
   an insulating layer on the base layer, wherein the insulating layer comprises a flame retardant-resin.

4. The package according to claim 1, wherein ends of the lead frame and reflective coating layer are aligned with each other.

5. The package according to claim 1, wherein ends of the reflective coating layer and base layer are aligned with each other.

6. The package according to claim 1, wherein an entire top surface of the base layer is substantially flat.

7. The package according to claim 1, wherein the bottom surface of the reflective coating layer is positioned higher than the topmost surface of the semiconductor light emitting diode chip.

8. A display device comprising:
   a package of a semiconductor light emitting diode, the package including a base layer;
   a semiconductor light emitting diode chip on the base layer;
   a lead frame electrically connected to the semiconductor light emitting diode chip;
   a reflective coating layer directly on the lead frame; and
   a molding material covering the semiconductor light emitting diode chip in a predetermined shape,
   wherein a bottom surface of the reflective coating layer is positioned higher than a bottom surface of the semiconductor light emitting diode chip,
   wherein the lead frame includes at least one end portion that is not covered with the reflective coating layer, the at least one portion of the lead frame being adjacent to the semiconductor light emitting diode chip,
   wherein a bottom surface of the reflective coating layer is substantially parallel to a top surface of the base layer,
   wherein a thickness from the bottom surface to a topmost surface of the reflective coating layer is thinner than a thickness from the bottom surface to a topmost surface of the semiconductor light emitting diode chip, and
   wherein the reflective coating layer comprises a white resin including at least one of titanium oxide, calcium carbonate, barium sulfate, and zinc oxide.

9. The display device according to claim 8, wherein the base layer comprises a metal.

10. The display device according to claim 8, the package further comprising:
    an insulating layer on the base layer and wherein the insulating layer comprises a flame retardant-4 resin.

11. The display device according to claim 8, wherein ends of the lead frame and reflective coating layer are aligned with each other.

12. The display device according to claim 8, wherein ends of the reflective coating layer and base layer are aligned with each other.

13. The display device according to claim 8, wherein an entire top surface of the base layer is substantially flat.

14. The display device according to claim 8, wherein the bottom surface of the reflective coating layer is positioned higher than the topmost surface of the semiconductor light emitting diode chip.

* * * * *